(12) United States Patent
Huang et al.

(10) Patent No.: US 12,362,201 B2
(45) Date of Patent: Jul. 15, 2025

(54) BEVEL EDGE REMOVAL METHODS, TOOLS, AND SYSTEMS

(71) Applicant: Taiwan Semiconductor Manufacturing Co., Ltd., Hsinchu (TW)

(72) Inventors: Hui-Chi Huang, Zhubei (TW); Jeng-Chi Lin, Hsinchu (TW); Pin-Chuan Su, Hsinchu (TW); Chien-Ming Wang, Tainan (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/872,620

(22) Filed: Jul. 25, 2022

(65) Prior Publication Data

US 2022/0359191 A1    Nov. 10, 2022

Related U.S. Application Data

(62) Division of application No. 16/727,533, filed on Dec. 26, 2019, now Pat. No. 11,664,213.

(51) Int. Cl.
| | |
|---|---|
| *H01L 21/02* | (2006.01) |
| *A46B 13/04* | (2006.01) |
| *B08B 1/00* | (2024.01) |
| *B08B 1/04* | (2006.01) |
| *B08B 1/12* | (2024.01) |

(Continued)

(52) U.S. Cl.
CPC ........ *H01L 21/02087* (2013.01); *A46B 13/04* (2013.01); *B08B 1/12* (2024.01); *B08B 1/32* (2024.01); *B08B 3/08* (2013.01); *B08B 5/04* (2013.01); *B08B 7/04* (2013.01); *A46B 2200/30* (2013.01)

(58) Field of Classification Search
CPC ........ H01L 21/02087; H01L 21/67051; H01L 21/67219; H01L 21/67046; H01L 21/304; H01L 21/30625; A46B 13/04; A46B 2200/30; B08B 1/002; B08B 1/04; B08B 3/08; B08B 5/04; B08B 7/04; B24B 37/02; B24B 37/11; B24B 57/02
See application file for complete search history.

(56) References Cited

U.S. PATENT DOCUMENTS

| | | |
|---|---|---|
| 5,311,634 A | 5/1994 | Andros |
| 5,840,129 A | 11/1998 | Saenz et al. |

(Continued)

*Primary Examiner* — Alexander Markoff
(74) *Attorney, Agent, or Firm* — Slater Matsil, LLP

(57) ABSTRACT

A tool and methods of removing films from bevel regions of wafers are disclosed. The bevel film removal tool includes an inner motor nested within an outer motor and a bevel brush secured to the outer motor. The bevel brush is adjustable radially outward to allow the wafer to be inserted in the bevel brush and to be secured to the inner motor. The bevel brush is adjustable radially inward to engage one or more sections of the bevel brush and to bring the bevel brush in contact with a bevel region of the wafer. Once engaged, a solution may be dispensed at the engaged sections of the bevel brush and the inner motor and the outer motor may be rotated such that the bevel brush is rotated against the wafer such that the bevel films of the wafer are both chemically and mechanically removed.

20 Claims, 10 Drawing Sheets

(51) Int. Cl.
  *B08B 1/32*     (2024.01)
  *B08B 3/08*     (2006.01)
  *B08B 5/04*     (2006.01)
  *B08B 7/04*     (2006.01)

(56) References Cited

U.S. PATENT DOCUMENTS

| | | | | |
|---|---|---|---|---|
| 5,860,178 | A * | 1/1999 | Nishimura | H01L 21/67046 |
| | | | | 73/862.541 |
| 5,861,066 | A | 1/1999 | Moinpour et al. | |
| 5,862,560 | A | 1/1999 | Jensen et al. | |
| 5,937,469 | A | 8/1999 | Culkins et al. | |
| 5,976,267 | A | 11/1999 | Culkins et al. | |
| 6,003,185 | A | 12/1999 | Saenz et al. | |
| 6,113,467 | A * | 9/2000 | Koike | B24B 37/08 |
| | | | | 451/36 |
| 6,186,873 | B1 | 2/2001 | Becker et al. | |
| 6,334,229 | B1 * | 1/2002 | Moinpour | H01L 21/67028 |
| | | | | 451/245 |
| 6,550,091 | B1 * | 4/2003 | Radman | B08B 1/04 |
| | | | | 15/88.1 |
| 6,594,847 | B1 * | 7/2003 | Krusell | H01L 21/67051 |
| | | | | 15/103.5 |
| 6,910,240 | B1 * | 6/2005 | Boyd | H01L 21/67046 |
| 7,000,622 | B2 * | 2/2006 | Woods | B08B 3/04 |
| | | | | 134/94.1 |
| 7,115,023 | B1 * | 10/2006 | Owczarz | B24B 41/067 |
| | | | | 451/303 |
| 7,900,311 | B2 * | 3/2011 | Yudovsky | B08B 1/04 |
| | | | | 414/936 |
| 7,979,942 | B2 | 7/2011 | Hiaoka et al. | |
| 8,020,240 | B2 | 9/2011 | Hiraoka et al. | |
| 8,796,666 | B1 | 8/2014 | Huang et al. | |
| 9,012,132 | B2 | 4/2015 | Chang | |
| 9,028,915 | B2 | 5/2015 | Chang et al. | |
| 9,093,530 | B2 | 7/2015 | Huang et al. | |
| 9,146,469 | B2 | 9/2015 | Liu et al. | |
| 9,213,234 | B2 | 12/2015 | Chang | |
| 9,223,220 | B2 | 12/2015 | Chang | |
| 9,256,133 | B2 | 2/2016 | Chang | |
| 9,536,759 | B2 | 1/2017 | Yang et al. | |
| 9,548,303 | B2 | 1/2017 | Lee et al. | |
| 9,711,367 | B2 | 7/2017 | Chien et al. | |
| 10,073,347 | B1 | 9/2018 | Zi et al. | |
| 10,857,649 | B2 | 12/2020 | Lee et al. | |
| 2001/0044979 | A1 * | 11/2001 | Ravkin | H01L 21/67046 |
| | | | | 15/88.2 |
| 2007/0238393 | A1 | 10/2007 | Shin et al. | |
| 2013/0078810 | A1 * | 3/2013 | Lee | B24B 37/32 |
| | | | | 438/692 |
| 2014/0213153 | A1 | 7/2014 | Chang et al. | |
| 2015/0224532 | A1 | 8/2015 | Yang et al. | |
| 2015/0306637 | A1 * | 10/2015 | Zuniga | B24B 37/34 |
| | | | | 15/97.1 |

* cited by examiner

BEVEL EDGE REMOVAL METHODS, TOOLS, AND SYSTEMS

PRIORITY CLAIM AND CROSS-REFERENCE

This application is a divisional of U.S. patent application Ser. No. 16/727,533, filed on Dec. 26, 2019, which application is hereby incorporated herein by reference.

BACKGROUND

During semiconductor manufacturing, chemical mechanical polish (CMP) processes may be performed to remove excess materials of films, coatings, and other material layers deposited or otherwise applied over a semiconductor wafer and to planarize the semiconductor wafer. For example, excess material of a layer deposited over a semiconductor wafer may be contacted to a polishing pad of a CMP system, and one or both of the first polishing pad and the wafer may be rotated in order to grind excess material away. This grinding process may be assisted by the use of a CMP slurry, which may contain chemicals and abrasives that can assist in the grinding process and help remove the excess material.

Some films deposited over a substrate during semiconductor manufacturing tend to form wafer edge defects during subsequent handling and manufacturing steps (e.g., chemical mechanical polish (CMP) processes). Wafer edge film defects such as cracking, delaminating, peeling, flaking and other surface damage of these deposited films may lead to potential contamination and/or deep wafer scratches during the subsequent manufacturing steps. As such, semiconductor chip production runs the risk of low chip production yields and/or low chip reliability due to wafer edge film defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
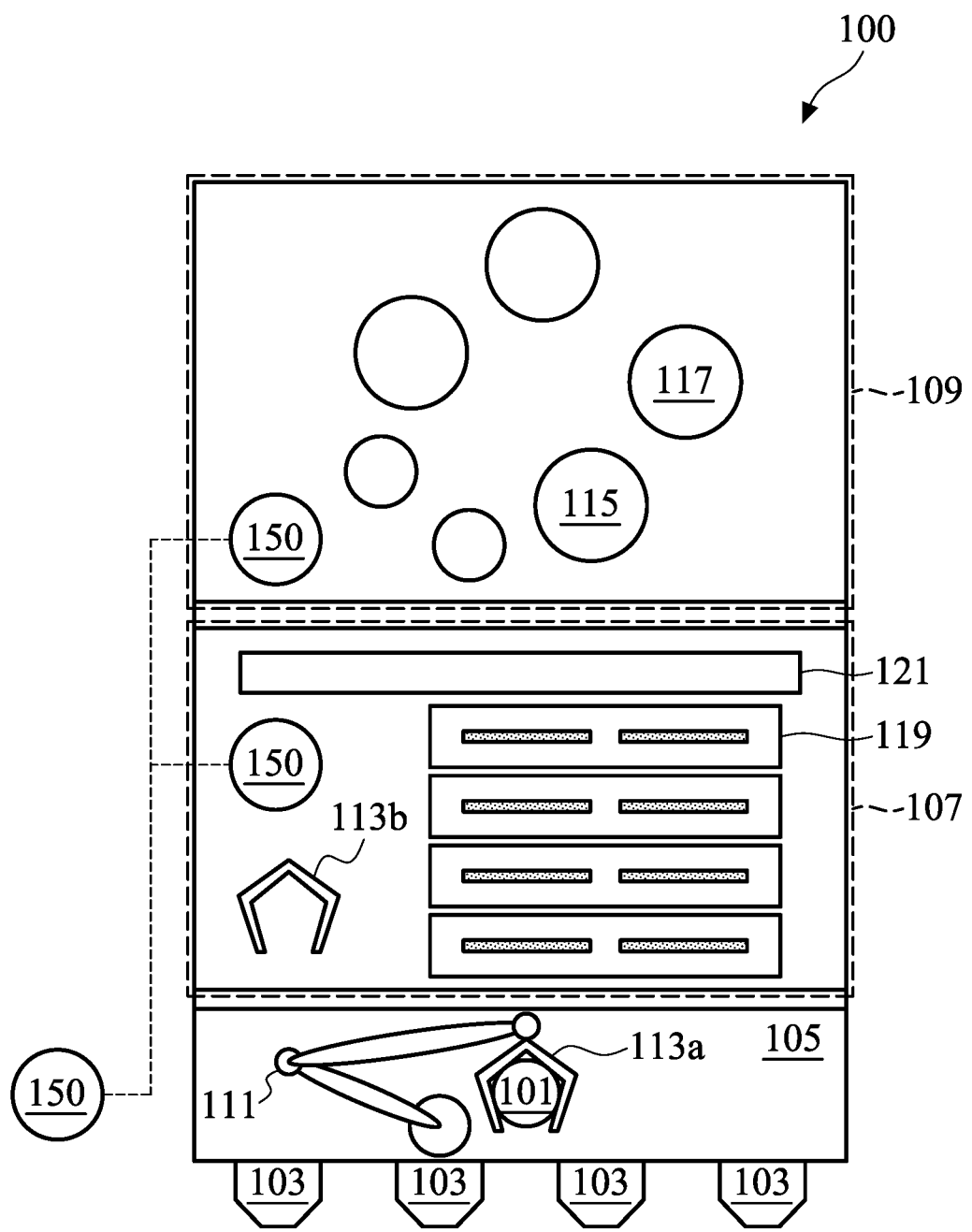
FIG. 1 illustrates a bevel removal tool integrated into a CMP system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a chemical mechanical polishing (CMP) system 100 comprising a bevel film removal tool 150, in accordance with some embodiments. During semiconductor manufacturing processes, series of film depositions may be combined with series of CMP processes to form stacks of alternating conductive layers and dielectric layers over a semiconductor substrate and may be referred to herein as a workpiece 101. During handling and subsequent processing of the workpiece 101, wafer edge film defects such as cracking, delaminating, peeling, flaking and other surface damage may form in bevel regions located along edge regions of the workpiece 101. Either before or after CMP processes, a bevel edge removal process may be performed to remove any flakes and/or to remove any delaminated portions of the materials within the bevel region in order to ensure the integrity of the stacks of alternating conductive layers and dielectric layers formed over the semiconductor substrate.

The bevel film removal tool 150, according to embodiments disclosed herein, is used to clean the bevel edge film of a workpiece 101 (e.g., a wafer) and remove any portions of the bevel edge film that may flake off or otherwise interfere with subsequent processes. By removing these portions before further processing, such a removal process helps to prevent contamination and/or deep wafer scratches from forming in the workpiece 101 during subsequent processing, such as subsequent CMP processing. Once the bevel edge film of the workpiece 101 has been cleaned, the workpiece 101 may be planarized (e.g., via a CMP process) in a step of fabricating a semiconductor device. As such, excess materials (e.g., conductive materials, insulating materials, and the like) that can potentially interfere with subsequent processes are removed from the surface of the workpiece 101. The bevel removal process ensures the integrity of the build-up of materials of the semiconductor substrate during the handling and subsequent processing of the workpiece 101.

FIG. 1 further illustrates, according to some embodiments, that more than one bevel film removal tool 150 may be incorporated into the CMP system 100. In some embodiments, the bevel film removal tool 150 may be incorporated into the polishing station 109 of the CMP system 100. In some embodiments, the bevel film removal tool 150 may be incorporated into the cleaning station 107 of the CMP system 100. As further illustrated in FIG. 1, the bevel film removal tool 150 may be a standalone system that operates separate from the CMP system 100, in some embodiments. In embodiments, one or more of the bevel film removal tool 150 may be located at each of these locations, at two of these locations, or at any one of these locations.

In addition to the bevel film removal tool 150, the CMP system 100 includes load ports 103, a handler 105, a cleaning station 107, and a polishing station 109. The load ports 103 may be used for loading the workpiece 101 into the CMP system 100, and then unloading the workpiece 101 once the CMP process has been completed. Once loaded, the handler 105 is used to transfer the workpiece 101 between the load ports 103, the cleaning station 107 and the polishing station 109 and between any components thereof. The handler 105 may comprise a robotic machine, an automated machine, or a transfer robot that is adapted to mechanically operate positioning and manipulation of various components within the CMP system 100 during processing. For example, the handler 105 may comprise components such as a robotic arm 111, a first carrier 113a, and/or a second carrier 113b, for example. The robotic arm 111 is adapted to connect and manipulate one or more of the first carrier 113a and/or the second carrier 113b during handling and processing.

The first carrier 113a and the second carrier 113b are adapted to retain a workpiece 101 during processing and include or are coupled to mechanisms (e.g., a vacuum head, a polishing head, and the like (not shown)) that are adapted to grasp onto and to rotate the first carrier 113a and the second carrier 113b during handling and processing of the workpiece 101. The first carrier 113a and the second carrier 113b may include a line, hose, or tube for connecting a vacuum generating device to the vacuum head of the first carrier 113a which may be used for picking up and retaining the workpiece 101 while moving the workpiece 101 to various stations of the CMP system 100 and during the CMP processing. The workpiece 101 may be retrieved from the load ports 103 by the first carrier 113a using, for example, the vacuum head to pick up and to retain the workpiece 101. Once retrieved, the handler 105 transfers the workpiece 101, e.g., via the robotic arm 111, to a desired component of the cleaning station 107 or the polishing station 109.

FIG. 1 further illustrates that, prior to the placement of the workpiece 101 onto the high-rate platen 115 (for the initiation of the CMP process), the first carrier 113a may place the workpiece 101 onto the bevel film removal tool 150 within the polishing station 109. The bevel film removal tool 150 comprises an outer motor 153, an inner motor 151, nested within and embedded within the outer motor 153, and a bevel brush 155, according to some embodiments. These elements are further illustrated and discussed in further detail below with respect to FIG. 2A-6C.

FIG. 1 further illustrates the polishing station 109 comprising a high-rate platen 115 that is adapted to support a first polishing pad (not shown). The first polishing pad may be removable and may be attached to the high-rate platen 115 by any suitable attachment method, such as, by an adhesive film, an adhesive, glue, or the like. The high-rate platen 115 and the first polishing pad are rotated during a CMP process by a mechanism (e.g., a motor (not shown)) coupled to the high-rate platen 115, for example. Once transferred to the polishing station 109, the handler 105 controls the robotic arm 111 to maneuver the first carrier 113a and, thus, the workpiece 101, over the high-rate platen 115. Once positioned over the high-rate platen 115, the handler 105 controls one or both of the first carrier 113a and the high-rate platen 115 to rotate the workpiece 101 and/or the attached polishing pad while controlling the polishing head to lower and press the workpiece 101 against the first polishing pad during the CMP process. The first polishing pad may comprise a relatively coarse material and the high-rate platen 115 may be rotated at relatively high rates of speed in order to provide a bulk removal of the excess materials of the workpiece 101 during the CMP process. The CMP process may be further assisted by dispensing a CMP slurry onto the first polishing pad while the workpiece 101 is pressed into the rotating polishing pad. The CMP slurry is used to chemically and/or physically assist the first polishing pad in the bulk removal of the excess materials of the workpiece 101. The polishing station 109 may comprise other features (not shown) such as heaters, sensors, and/or gauges used to sense and control temperatures, vibrations, pressures, and the like, within the polishing station 109 and components thereof. In some embodiments, a heater and a sensor may be used to sense and control temperatures and/or vibrations of the high-rate platen 115 during CMP processing. After the CMP process is complete, the workpiece 101 is lifted again by the vacuum head, and the workpiece 101 is returned to the load ports 103 or is transferred to another station in the CMP system 100.

The polishing station 109 further comprises a buffing platen 117 that is adapted to support a second polishing pad (not shown) attached to the buffing platen 117. The second polishing pad may be attached to the buffing platen 117 via any suitable method used to attach the first polishing pad to the high-rate platen 115 and the buffing platen 117 and the second polishing pad are rotated during a CMP process by the same or by a similar mechanism (e.g., a motor (not shown)) coupled to the buffing platen 117, for example. Once transferred to the polishing station 109, the handler 105 controls the robotic arm 111 to maneuver the first carrier 113a and, thus, the workpiece 101, over the buffing platen 117 and controls rotations of one or both of the first carrier 113a and the buffing platen 117 while controlling the polishing head to lower and press the workpiece 101 against the second polishing pad during the CMP process. The second polishing pad may comprise a relatively fine material and the buffing platen 117 may be rotated at relatively low rates of speed in order remove materials of the workpiece 101 during the CMP process at slower rates and also to fix defects and scratches that may occur during the high-rate removal. The CMP process performed using the buffing platen 117 may be assisted by using another slurry to chemically and/or physically assist the second polishing pad in the slow rate of removal of the materials and in the fixing of defects and scratches in the workpiece 101. In some embodiments, a heater and a sensor may be used to sense and control temperatures and/or vibrations of the buffing platen 117 during CMP processing. After the CMP process is complete, the workpiece 101 is lifted again by the vacuum head, and the workpiece 101 is returned to the load ports 103 or is transferred to another station in the CMP system 100.

FIG. 1 further illustrates the cleaning station 107 comprising roller brushes 119, a cleaning bath 121 and/or an optional wafer dryer (not shown). In some embodiments, after completion of a CMP process, the handler 105 transfers the workpiece 101 to the cleaning station 107 to be cleaned. In some embodiments, the workpiece 101 is transferred from the first carrier 113a to a second carrier 113b adapted to support the workpiece 101 during subsequent handling and wafer cleaning processes. Once transferred to the cleaning station 107, the workpiece 101 is cleaned using the roller brushes 119, de-ionized water, and a cleaning solution comprising SC-1, $NH_4OH$, HF, citric acid, or other chemicals, for example, according to some embodiments. The workpiece 101 may also be cleaned in the cleaning bath 121 (e.g., cleaning vat). The workpiece 101 may also be cleaned using any suitable methods, any suitable devices, and any suitable materials. Cleaning the workpiece 101 comprises substantially removing the CMP slurry and debris from the workpiece 101. Once cleaned, the workpiece 101 may be transferred to the optional wafer dryer, in some embodiments. For example, the cleaned workpiece 101 may be placed on a support adapted to dry wafers and a drying agent such as nitrogen, isopropyl alcohol, isopropanol, or other chemicals may be applied in order to dry the surface of the workpiece 101.

In some embodiments, the CMP system 100 includes the vacuum generating device (not shown) attached, for example, to the polishing station 109, the cleaning station 107, and the handler 105 of the CMP system 100 to provide suction to one or more components and to control ambient pressures within the CMP system 100 during operation. For example, the vacuum generating device may provide suction to the polishing station 109 to secure polishing pads to one or more of the high-rate platen 115 and the buffing platen 117, to control the dispensing of CMP slurry, and to control the waste and debris removal during CMP operations. As another example, the vacuum generating device may provide suction to the cleaning station 107 during cleaning operations to control the dispensing of cleaning solutions and/or drying agents, to control the waste and debris removal from the roller brushes 119, and to secure the workpiece 101 to the support adapted to dry wafers. As a further example, the vacuum generating device may provide suction to the handler 105 during handling operations to control pneumatic processes of the robotic arm 111.

Figure 2A:
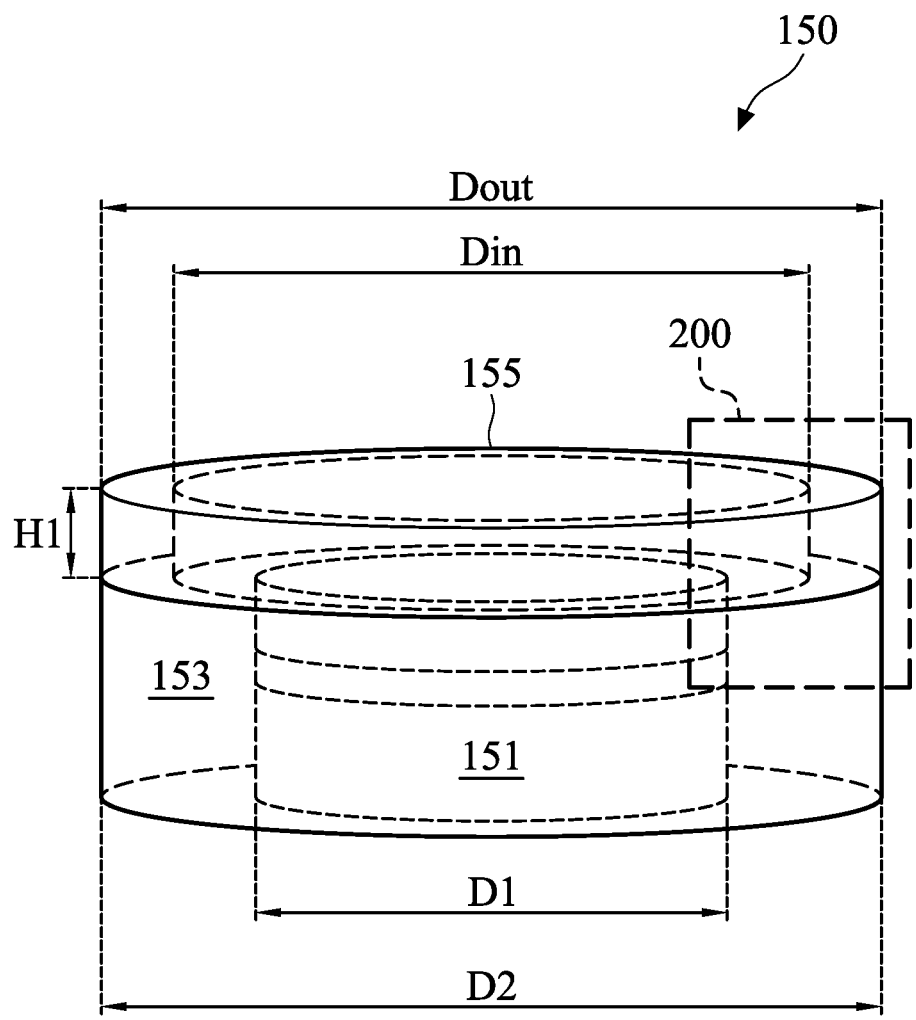
FIG. 2A illustrates a perspective view of the bevel film removal tool, in accordance with some embodiments.

FIG. 2A illustrates a perspective view of the bevel film removal tool 150, according to some embodiments. Features of the bevel film removal tool 150 have been illustrated as being transparent to illustrate the nesting of inner components and outer components of the bevel film removal tool 150. The bevel film removal tool 150 comprises an outer motor 153, an inner motor 151 nested within the outer motor 153, and a bevel brush 155, according to some embodiments.

The inner motor 151 is nested within and co-axially aligned with the outer motor 153. According to some embodiments, the inner motor 151 comprises a flat, circular-shaped, upper surface serving as a rotatable platform for the workpiece 101 during bevel removal operations. The inner motor 151 may have a diameter equal to a first distance D1 that is smaller than a diameter of the workpiece 101. According to some embodiments, the first distance D1 of the inner motor 151 is between about 50 mm and about 200 mm, such as about 100 mm.

The outer motor 153 comprises a flat, annular-shaped (e.g., ring-shaped), upper surface serving as a rotatable platform for the bevel brush 155 during bevel removal operations. The outer motor 153 may have a diameter equal to a second distance D2 that is larger than the diameter of the workpiece 101. According to some embodiments, the second distance D2 of the outer motor 153 is between about 100 mm and about 300 mm, such as about 250 mm.

According to some embodiments, the upper surface of the inner motor 151 is co-planar with the upper surface of the outer motor 153. However, in some embodiments, top surfaces of the inner motor 151 and the outer motor 153 lie in different planes.

FIG. 2A further illustrates that the bevel brush 155 is disposed over and attached to the outer motor 153. According to some embodiments, the bevel brush 155 is sized in order to accommodate the size of the workpiece 101 (e.g., semiconductor wafer) that is desired to be cleaned by the bevel brush 155. In one embodiment the bevel brush 155 may be sized to accommodate a six inch semiconductor wafer, while in another embodiment the bevel brush 155 may be sized to accommodate an eight inch semiconductor wafer. In yet another embodiment the bevel brush 155 is sized to accommodate a twelve inch semiconductor wafer, while in yet another embodiment the bevel brush 155 is sized to accommodate an eighteen inch semiconductor wafer or a twenty-five inch semiconductor wafer. Any suitable semiconductor wafer size may be utilized.

According to some embodiments, the bevel brush 155 is annular-shaped and has an inner surface with an inner diameter Din of less than about 18 inches, such as about 10 inches and has an outer surface with an outer diameter Dout of between about 6 inches and about 25 inches, such as about 14 inches. In some embodiments, the bevel brush 155 has a first height H1 of between about 0.5 cm and about 100 cm, such as about 3 cm. However, any suitable height and any suitable diameters may be used for the bevel brush 155. In some embodiments, the inner diameter Din of the bevel brush 155 is at least as big as the first distance D1 of the inner motor 151 and the outer diameter Dout of the bevel brush 155 is at least as big as the second distance D2 of the outer motor 153.

According to some embodiments, the bevel brush 155 may comprise a material such as, polybutylene terephthalate (PBT), nylon (e.g., nylon 6, nylon 66, nylon 612), polyvinyl chloride (PVC), polypropylene (PP), polyethylene terephthalate (PET), polyvinyl acetate (PVA), nitrile rubber (NBR), styrene-butadiene rubber (SBR), silicone-rubber (SI VMQ), fluoro-elastomer (VITON FKM), or the like. Different materials that may be used for the brushing surfaces of the bevel brush 155 have different properties which provide certain characteristics (e.g., porosity, resistance to wear, polishing resistivity, resistance to chemical decomposition, acid/base resistivity, elasticity, or the like, and combinations thereof). As such, materials for the bevel brush 155 may be chosen based one or more of the characteristics of the material itself and may be chosen based on process criteria with respect to a desired bevel removal process, characteristics of the materials to be removed in the bevel region, characteristics of a desired slurry to be used, characteristics of a desired cleaning solution to be used, or the like, and combinations thereof.

Additionally, the bevel brush 155 may have a porosity of between about 0% by volume and about 95% by volume, such as about 30% by volume. However, any suitable material with any suitable porosity may be utilized. According to some embodiments, the porosity of the bevel brush 155 may be selected based on desired criteria of the bevel removal process. For example, the porosity may be chosen based on a desired flow rate of a fluid to be dispensed through the bevel brush 155, as described below with respect to FIG. 5. However, any suitable porosity may be used.

FIG. 2A further illustrates a section 200 of the bevel film removal tool 150 that is outlined by a dashed line. Section 200 of the bevel film removal tool 150 is referenced below in greater detail with respect to certain dimensions of the bevel film removal tool 150 and with respect to operation of the bevel film removal tool 150 during a bevel film removal process.

Figure 2B:
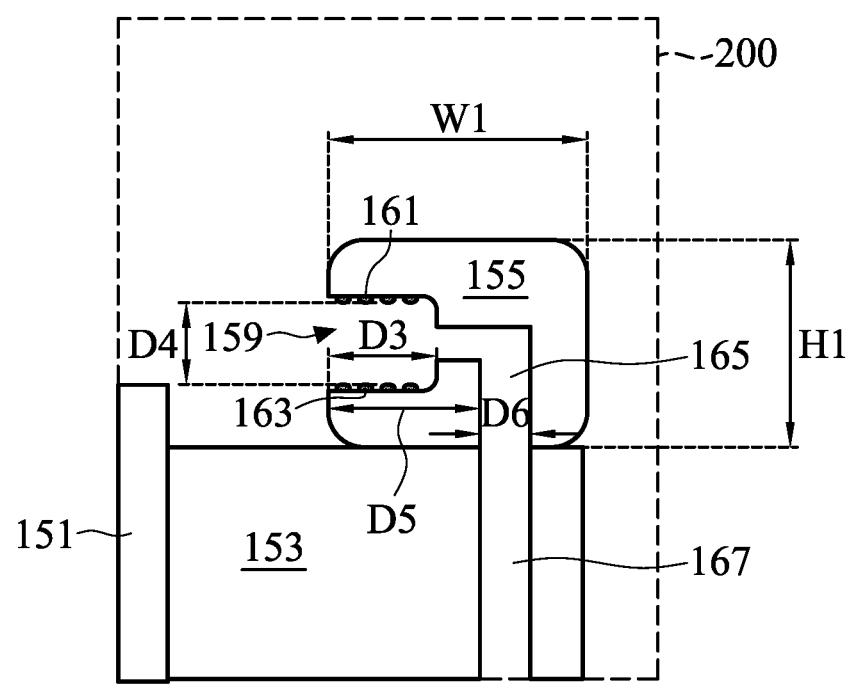
FIG. 2B illustrates a magnified view of a cross-section of the bevel film removal tool within a section outlined in FIG. 2A.

FIG. 2B illustrates a magnified view of a cross-section of the bevel film removal tool 150 within the section 200 outlined in FIG. 2A. In particular, FIG. 2B illustrates the bevel brush 155 attached to the outer motor 153. The bevel brush 155 is removable and may be mechanically fastened, adhered, suctioned or otherwise fixed to the outer motor 153. However, any suitable method of securing the bevel brush 155 to the outer motor 153 may be utilized.

According to some embodiments, the bevel brush 155 has a first width W1 that is a difference between the inner diameter Din and the outer diameter Dout. In a particular embodiment the first width W1 between its inner surface and its outer surface may be between about 2 mm and about 100 mm, such as about 10 mm. The bevel brush 155 comprises a groove 159 extending from the inner surface of the bevel brush 155 to a depth equal to a third distance D3. The third distance D3 of the depth of the bevel brush 155 may be adapted to a size of a bevel region of the workpiece 101. According to some embodiments, the third distance D3 of the depth of the bevel brush 155 is between about 2 mm and about 100 mm, such as about 10 mm.

Additionally, the groove 159 opens toward the inner surface of the bevel brush 155 and, within the bevel brush 155, the groove 159 opens to a series of micro channels 165 extending to an exterior surface of the bevel brush 155 for connection to a vacuum generating device to help remove debris and cleaning solution. For example, the micro channels 165 may extend to a bottom surface of the bevel brush 155, as illustrated in FIG. 2B. However, the micro channels 165 may extend to any exterior surface of the bevel brush 155, such as the outer surface of the bevel brush 155, the outer surface being opposite the inner surface comprising the opening of the groove 159.

According to some embodiments, a first sidewall of the groove 159 houses front-side dispensers 161 at a front-side brushing surface of the bevel brush 155 and a second sidewall of the groove 159 houses back-side dispensers 163 at a back-side brushing surface of the bevel brush 155, wherein the back-side dispensers 163 and the back-side brushing surface face the front-side dispensers 161 and the front-side brushing surface. According to some embodiments, the front-side brushing surface and/or the front-side dispensers 161 are separated from the back-side brushing surface and/or the back-side dispensers 163 by a fourth distance D4 and the fourth distance D4 may be adapted to a thickness of the workpiece 101. According to some embodiments, the fourth distance D4 is between about 0.5 mm and about 5 mm, such as about 1 mm, in accordance with some embodiments.

According to some embodiments, the bevel brush 155 additionally includes a micro tube manifold (not shown) embedded within the bevel brush 155. In such an embodiment the micro tube manifold may be utilized to dispense solutions (described further below with respect to FIG. 5) through the front-side dispensers 161 at the front-side brushing surface of the bevel brush 155 and/or through back-side dispensers 163 at the back-side brushing surface of the bevel brush 155. However, any suitable method of dispensing fluids, such as a nozzle located outside of the bevel brush 155, may be utilized.

In some embodiments, the bevel brush 155 is placed over the outer motor 153 such that the micro channels 165 of the bevel brush 155 are aligned with the suction manifold channels 167 formed through the upper surface of the outer motor 153. According to some embodiments, transitions between the micro channels 165 of the bevel brush 155 and the suction manifold channels 167 of the outer motor 153 are spaced a fifth distance D5 from the inner surface of the bevel brush 155 of between about 4 mm and about 110 mm, such as about 5 mm. In some embodiments, the transitions between the micro channels 165 and the suction manifold channels 167 have widths equal to a sixth distance D6 of between about 5 mm and about 100 mm, such as about 10 mm. However, any suitable spacing and any suitable widths may be used for the transitions between the micro channels 165 and the suction manifold channels 167. In some embodiments, widths of the suction manifold channels 167 of the outer motor 153 are the same as the widths of the micro channels 165 of the bevel brush 155. Although, any suitable widths may be used for the suction manifold channels 167 and the suction manifold channels 167 may be larger or may be smaller than the widths of the micro channels 165.

Figure 3:
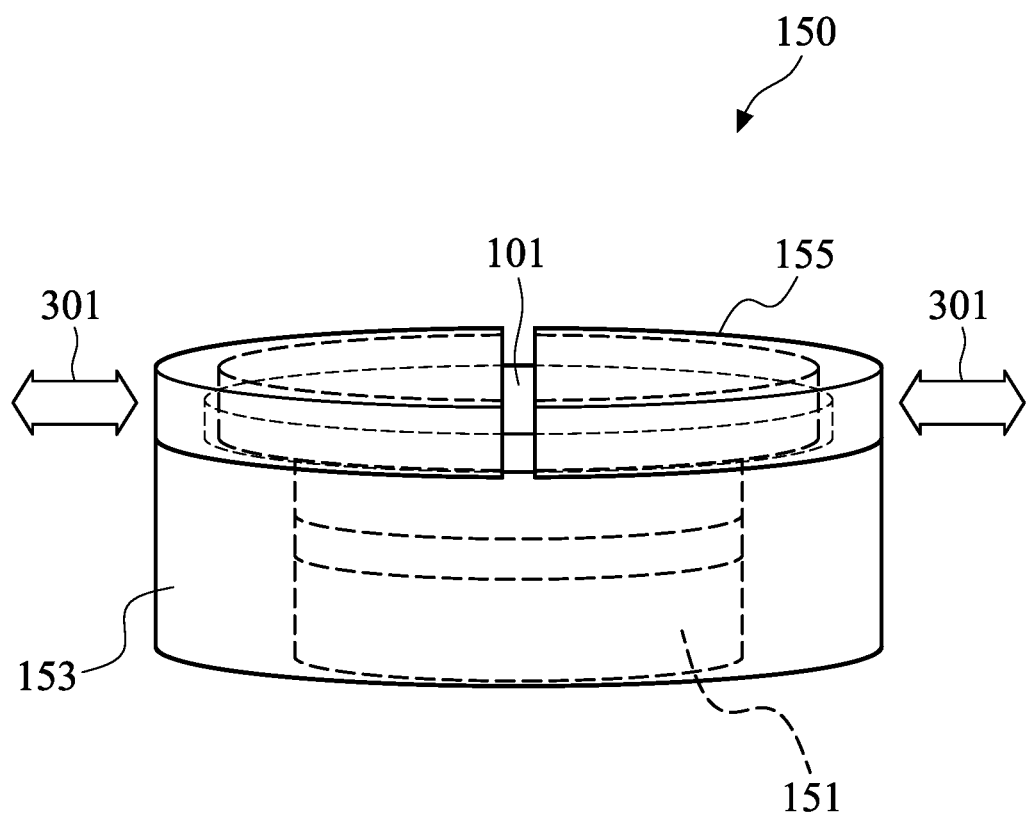
FIG. 3 illustrates a perspective view of the bevel film removal tool with a workpiece placed within the bevel film removal tool, according to some embodiments.

FIG. 3 illustrates a perspective view of the bevel film removal tool 150 with the workpiece 101 placed within the bevel film removal tool 150, according to some embodiments. The bevel brush 155 is adapted to open, in some embodiments, by moving one or more sections of the bevel brush 155 radially outward (as indicated by the directional arrows 301) to expose the upper surface of the inner motor 151. In one embodiment the opening of the bevel brush can be achieved by moving the inner motor 151 and/or the outer motor 153 horizontally in order to adjust the distance between the workpiece 101 and the bevel brush 155. However, any suitable arrangement for opening the bevel brush 155 may be utilized.

Once the bevel brush 155 has been opened, the handler 105 may transfer and place (e.g., using the robotic arm 111) the workpiece 101 on the upper surface of the inner motor 151. With the workpiece 101 placed in the bevel film removal tool 150, the bevel brush 155 is adapted to close by moving the one or more sections of the bevel brush 155 radially inward (as indicated by the directional arrows 301) such that a bevel region of the workpiece 101 is secured between the sidewalls of the groove 159 of the bevel brush 155 and such that the front-side brushing surface housing the front-side dispensers 161 is in contact with a bevel region on a front-side surface of the workpiece 101 and/or the back-side brushing surface housing the back-side dispensers 163 is in contact with a bevel region on a back-side of the workpiece 101.

Figure 4:
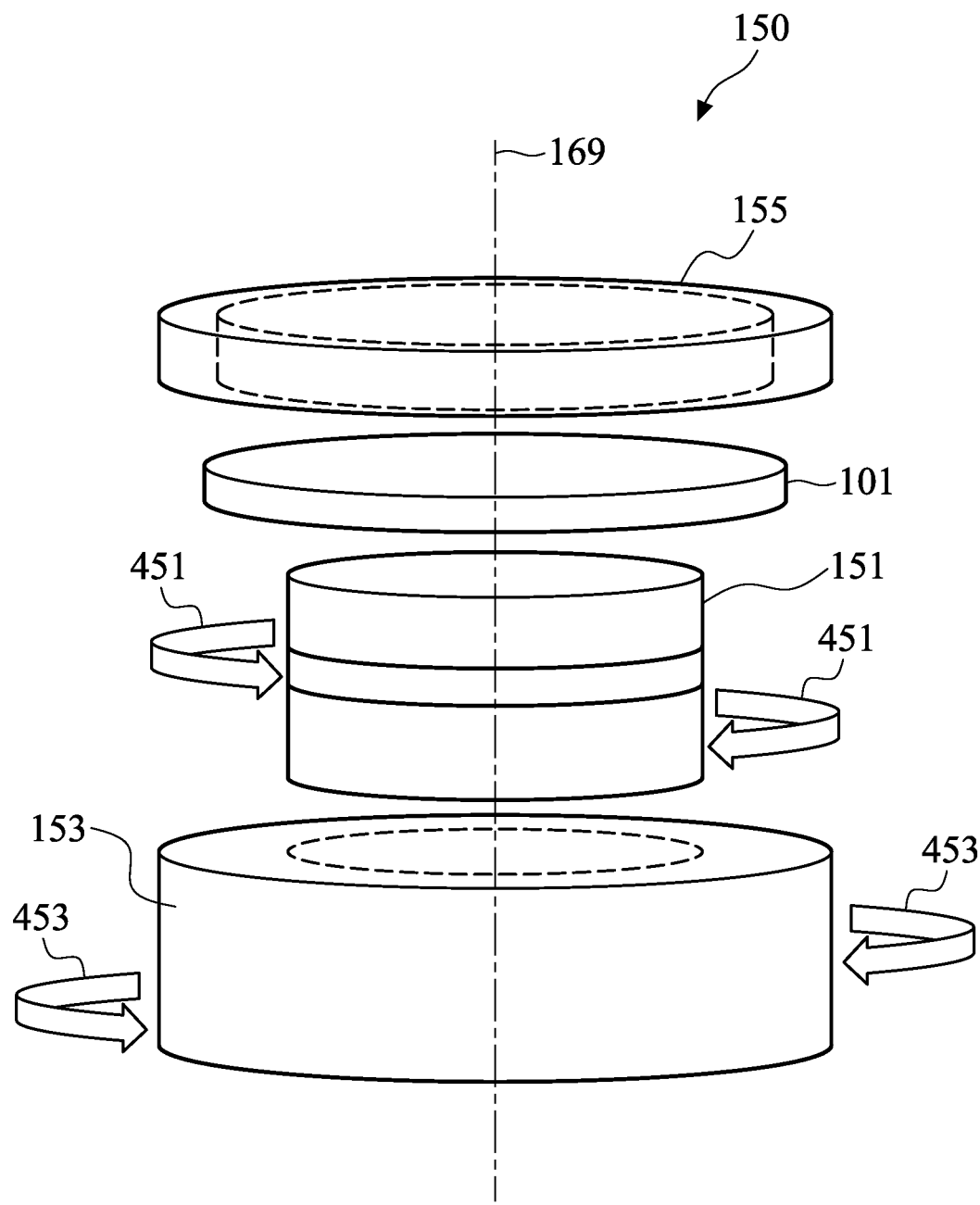
FIG. 4 illustrates an exploded view of the bevel film removal tool illustrated in FIG. 3.

FIG. 4 illustrates an exploded view of the bevel film removal tool 150 illustrated in FIG. 3. The inner motor 151 is adapted to freely rotate while nested within the outer motor 153 and may be rotated in a clockwise direction or a counter-clockwise direction as indicated by the directional arrows 451. As such, during operation, the inner motor 151 may be utilized to spin the workpiece 101 around a first axis of rotation 169, which extends through the workpiece 101 itself, in either of the clockwise or counter-clockwise direction as indicated by the directional arrows 451, against the front-side brushing surface housing the front-side dispensers 161 of the bevel brush 155 and/or against the back-side brushing surface housing the back-side dispensers 163 of the bevel brush 155. Furthermore, the outer motor 153 is adapted to freely rotate about the inner motor 151 and may be rotated in the clockwise direction or the counter-clockwise direction around the first axis of rotation 169 as indicated by the directional arrows 453. As such, during operation, the outer motor 153 may be utilized to spin the bevel brush 155, in either of the clockwise or counter-clockwise direction as indicated by the directional arrows 453, against the front-side surface and the back-side of the workpiece 101.

According to some embodiments, the bevel film removal tool 150 may be operated in a one-motor mode in which either the inner motor 151 is operated by itself without the rotation (or even presence) of the outer motor 153 or in which the outer motor 153 is operated by itself without the rotation (or even presence of the inner motor 151. In other embodiments, the bevel film removal tool 150 may be operated in a two-motor mode in which both the inner motor 151 and the outer motor 153 are rotated simultaneously for a desired period of time. Either of these modes helps to remove potentially damaging films or materials deposited in the bevel region of the workpiece 101.

In the one-motor mode, the bevel film removal tool 150 may operate, according to some embodiments, in a wafer-only mode such that only the workpiece 101 is spun by the inner motor 151 while the outer motor 153 maintains the bevel brush 155 in place. According to embodiments, the inner motor 151 rotates in the wafer-only mode at speeds between about 10 rpm and about 1000 rpm, such as about 200 rpm for a period of time of between about 5 sec and about 1200 sec, such as about 60 sec.

In some embodiments, the bevel film removal tool 150 may operate in the one-motor mode using a brush-only mode such that only the bevel brush 155 is spun by the outer motor 153 while the inner motor 151 maintains the workpiece 101 in place. According to embodiments, the outer motor 153 rotates in the brush-only mode at speeds between about 10 rpm and about 1000 rpm, such as about 200 rpm for a period of time of between about 5 sec and about 1200 sec, such as about 60 sec.

In the two-motor mode, the bevel film removal tool 150 may operate in a co-rotation mode or in a reverse rotation mode. According to some embodiments, in the co-rotation mode, the bevel film removal tool 150 operates such that the workpiece 101 is spun at a first speed by the inner motor 151 in either a clockwise direction or a counter-clockwise direction while the outer motor 153 spins the bevel brush 155 at a second speed in the same direction as the direction of the inner motor 151, the second speed being different from the first speed. Speeds of rotation of the inner motor 151 and the outer motor 153 are maintained within certain ranges of operation to allow for full effectiveness of the bevel clean process. For example, the speeds of rotation are kept above certain speeds to allow for proper bevel cleaning performance and the speeds of rotation are kept below certain speeds to prevent instability of the wafer during operation. According to embodiments, the inner motor 151 rotates in the co-rotation mode at a first speed between about 10 rpm and about 1000 rpm, such as about 200 rpm and the outer motor 153 rotates in the co-rotation mode at a second speed between about 10 rpm and about 1000 rpm, such as about 250 rpm for a period of time of between about 5 sec and about 1200 sec, such as about 60 sec.

According to some embodiments, in the reverse-rotation mode, the bevel film removal tool 150 operates such that the workpiece 101 is spun at a first speed by the inner motor 151 in either a clockwise direction or a counter-clockwise direction while the outer motor 153 spins the bevel brush 155 at a second speed in the opposite direction as the direction of the inner motor 151. When the bevel film removal tool 150 operates in the reverse-rotation mode, the inner motor 151 and the outer motor 153 may operate at the same speed or at different speeds. According to embodiments, the inner motor 151 rotates in the reverse-rotation mode at a first speed between about 10 rpm and about 1000 rpm, such as about 200 rpm and the outer motor 153 rotates in the reverse-rotation mode at a second speed between about 10 rpm and about 1000 rpm, such as about 250 rpm for a period of time of between about 5 sec and about 1200 sec, such as about 60 sec. However, any suitable speeds may be used.

Figure 5:
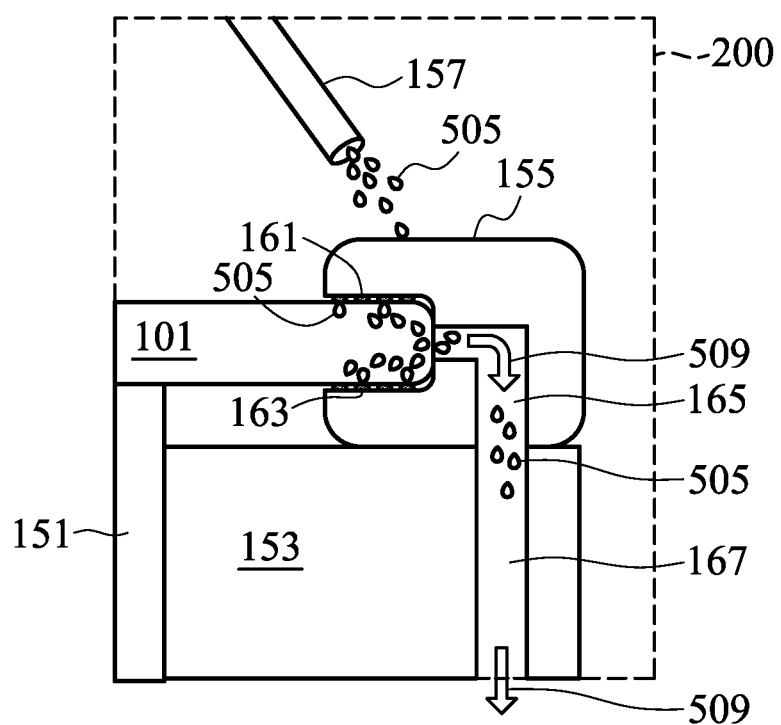
FIG. 5 illustrates a dispensing of a cleaning solution in the magnified view of the cross-section of the bevel film removal tool within the section outlined in FIG. 2A during bevel removal operations, in accordance with some embodiments.

FIG. 5 illustrates a dispensing of a cleaning fluid 505 during bevel removal operations, in accordance with some embodiments. A solution storage unit, a pump, and a delivery tube of a liquid transfer system (not shown) may be connected to the bevel film removal tool 150 and are used to dispense the cleaning fluid 505 to the bevel brush 155. For example, the cleaning fluid 505 may be transferred via the liquid transfer system from a central chemical storage tank of a wafer fabrication plant, through the CMP system 100 to the bevel brush 155. The cleaning fluid 505 may be dispensed prior to rotation of the bevel brush 155 and/or dispensed while the bevel brush 155 is being rotated and may be dispensed for one or more chosen periods of time. According to some embodiments, the cleaning fluid 505 is dispensed at a flow rate of between about 10 ml/min and about 2000 ml/min, such as about 600 ml/min for one or more chosen periods of time of between about 5 sec and about 1200 sec, such as about 60 sec.

Given compositions of the cleaning fluid 505 depend on types of materials to be polished or removed within the bevel region of the workpiece 101 and depend on the materials and composition of the brushing surfaces of the bevel brush 155. For example, certain materials used for the brushing surfaces of the bevel brush 155 may be more resistant to wear due to polishing than other materials, certain other materials may be more resistant to acid corrosion, and still certain other materials may be more resistant to alkali corrosion. Depending on the desired resistive properties of the materials used for the brushing surfaces of the bevel brush 155, the desired composition of the slurry used during CMP of the workpiece 101 the composition of a desired cleaning fluid 505 to be used during cleaning of the bevel removal process performed at the bevel removal station 150 may be selected to have a same composition as the slurry being used during a CMP of the workpiece 101 performed at the polishing station 109. As such, the cleaning fluid 505 may be transferred to the bevel removal station 150 from the same central chemical storage tank used to deliver the slurry to the polishing station 109. In some embodiments, the cleaning fluid 505 comprises one or more solutions including deionized (DI) water, acid, alkali, and organic solution. However, any suitable solutions may be used. The cleaning fluid 505 is configured to chemically dissolute and/or chemically reacts with the materials and films deposited in the bevel regions of the workpiece 101 in order to assist the bevel brush 155 in abrading and/or removal of the materials and films deposited in the bevel regions. As such, compositions of the cleaning fluid 505, compositions of the brushing surfaces of the bevel brush 155, rotation speeds and directions of the inner motor 151 and the outer motor 153, and durations of the bevel removal operations are chosen based on the types of material to be polished or removed within the bevel region of the workpiece 101.

In some embodiments, the delivery tube is physically coupled to the bevel brush 155 with the cleaning fluid 505 being routed through the bevel brush 155 to the front-side dispensers 161 and/or to the back-side dispensers 163. In other embodiments, the delivery tube is coupled to a nozzle 157 that is suspended over the bevel brush 155 and the solution is dispensed on and soaked into material of the bevel brush 155.

During bevel removal operations, the cleaning fluid 505 is forced by the pump through the delivery tube to the front-side dispensers 161 of the bevel brush 155 and/or to the back-side dispensers 163 of the bevel brush 155. As such, the cleaning fluid 505 is distributed to the bevel regions of the front-side and/or back-side of the workpiece 101, as either of or as both of the workpiece 101 and/or the bevel brush 155 is rotated.

In bevel removal operations, portions of an edge of the film and/or material deposited onto the workpiece 101 which may otherwise come off and damage subsequent processes is removed by physical means (e.g., physical brushing) and/or chemical means (e.g., chemical dissolution). Bevel removal operations may sometimes be referred to as "edge bevel removal," "edge bead removal," or "edge removal." Removing the potentially damaging films and/or material from the edge of the workpiece 101 allows the workpiece 101 to be processed and handled without any of the film and/or material at the edge peeling and/or flaking off and leading to potential contamination and/or deep wafer scratches during subsequent manufacturing steps.

In some embodiments, the vacuum generating device may be attached to the bevel film removal tool 150 to secure one or more of the workpiece 101 to the inner motor 151; secure the bevel brush 155 to the outer motor 153; to control dispensing of the cleaning fluid 505 from the nozzle 157; and also to control the removal of waste and debris during bevel film removal operations. According to some embodiments, the vacuum generating device is coupled to one or more vacuum pipes (not shown) inside the various components such being coupled to the inner motor 151, coupled to the location of the bevel brush 155 on the outer motor 153, and coupled to the suction manifold channels 167 of the outer motor 153.

During bevel film removal operations, the vacuum generating device is operated to secure the workpiece 101 to the inner motor 151 by suction through one of the one or more vacuum pipes. According to some embodiments, the vacuum generating device provides a first vacuum through the vacuum pipe (not shown) of the inner motor 151 to secure the workpiece 101 to the inner motor 151. The first vacuum may be between about 100 torr and about 650 torr, such as about 500 torr, during bevel film removal operations.

Additionally, the outer motor 153 may comprise another one of the one or more vacuum pipes (not shown) disposed below the engaged portion of the bevel brush 155 in an area between the suction manifold channels 167 and a center of the outer motor 153 or in an area between the suction manifold channels 167 and an outer perimeter of the outer motor 153. According to some embodiments, the vacuum generating device provides a second vacuum through the other vacuum pipe (not shown) in the outer motor 153 to secure the bevel brush 155 to the outer motor 153. The second vacuum may be the same as the first vacuum or the first and second vacuum may be different. According to some embodiments, the second vacuum may be between about 100 torr and about 650 torr, such as about 500 torr, during bevel film removal operations.

During bevel film operations, the vacuum generating device is further utilized to help control a flow of the cleaning fluid 505, along with any waste and/or debris removed by the bevel brush 155, through the micro channels 165 of the bevel brush 155 and through the suction manifold channels 167 of the outer motor 153, as indicated by the directional arrows 509 in FIG. 5. Once drawn by the vacuum generating device through the suction manifold channels 167, the cleaning fluid 505, along with the waste and/or debris, may be collected for discard and/or for recycling. According to some embodiments, the vacuum generating device provides a vacuum rate of between about 100 ml/min and about 1000 ml/min, such as about 800 ml/min, during bevel film removal operations.

Furthermore, the start times of one or more of the rotation of the bevel brush 155, the rotation of the workpiece 101, and the dispensing of the cleaning fluid 505 may be coordinated to start at about the same time as the start time of the vacuum, according to some embodiments. Further still, one or more of the stop times of the rotation of the bevel brush 155, the rotation of the workpiece 101, and the dispensing of the cleaning fluid 505 may be coordinated to stop at about the same time as the stop time of the vacuum, according to some embodiments. However, the start times and/or stop times may not be coordinated with the start time of the vacuum. For example, the start and stop times for the rotation for the bevel brush 155 may be coordinated with the start and stop times of the rotation for the workpiece 101 and/or the start and stop times for the dispensing of the cleaning fluid may be coordinated with the start and stop times for the suction of the vacuum. Furthermore, one or more of the rotating of the bevel brush 155, the rotating of the workpiece 101, the dispensing of the cleaning fluid 505, and the suction of the vacuum may be continuous during bevel film removal operations or the rotating, dispensing and/or the suction may be discontinuous during bevel film removal operations. Any suitable combinations of adding and stopping the various process conditions may be utilized, and all such combinations are fully intended to be included within the scope of the embodiments.

In bevel removal operations, portions of an edge of the film and/or material deposited onto the workpiece 101 which may otherwise come off and damage subsequent processes is removed by physical means (e.g., physical brushing) and/or chemical means (e.g., chemical dissolution). Bevel removal operations may sometimes be referred to as "edge bevel removal," "edge bead removal," or "edge removal." Removing the potentially damaging films and/or material from the edge of the workpiece 101 allows the workpiece 101 to be processed and handled without any of the film and/or material at the edge peeling and/or flaking off and leading to potential contamination and/or deep wafer scratches during subsequent manufacturing steps.

Figure 6A:
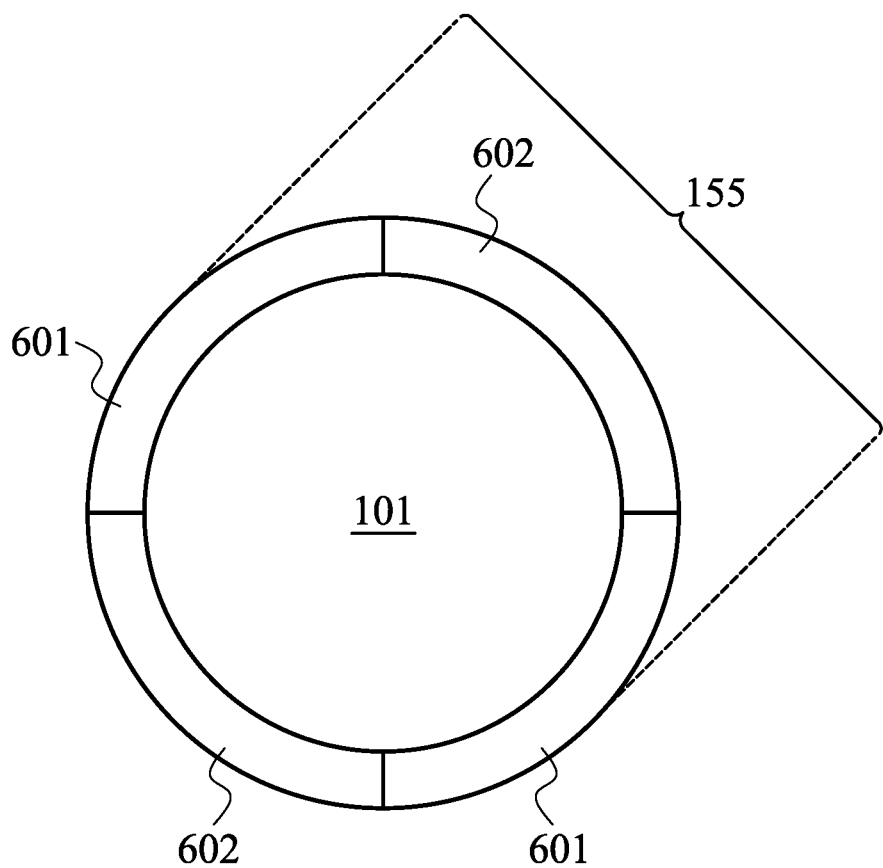
FIGS. 6A-6C illustrate in top-down views the bevel brush comprising a plurality of brush sections and engaged with the workpiece, according to some embodiments.
Figure 6B:
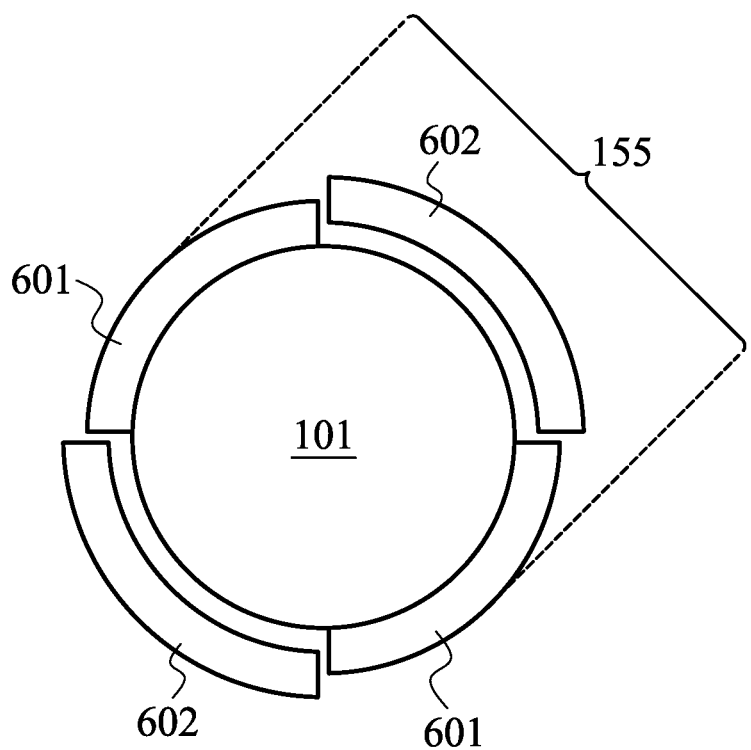
Figure 6C:
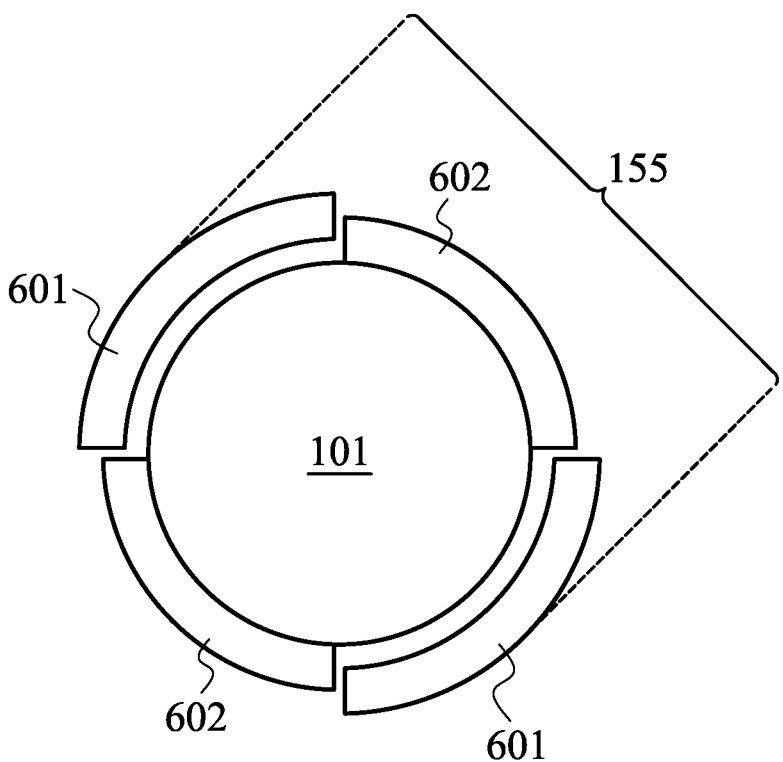

FIGS. 6A-6C illustrate in top-down views embodiments in which the bevel brush 155 comprises a plurality of brush sections, according to some embodiments. In a particular embodiment, FIG. 6A illustrates the bevel brush 155 comprising first brush sections 601 and second brush sections 602 closed around and retaining the workpiece 101. In some embodiments, the first brush sections 601 comprise a first brush material having a first composition and the second brush sections 602 comprise a second brush material having a second composition, the second composition being different from the first composition. Furthermore, the first brush material of the first brush sections 601 and the second brush material of the second brush sections 602 may be any suitable brush material and may have any suitable porosity as set forth above for the bevel brush 155. The first brush sections 601 and the second brush sections 602 may operate together or may operate independently during bevel film removal processes. Although embodiments, are illustrated with two brush sections (e.g., first brush sections 601 and second brush sections 602), it is understood that any suitable number of brush sections (e.g., three, four, five, or even more brush sections) and any suitable brush materials having any suitable porosities and any suitable compositions may be utilized for the plurality of brush sections of the bevel brush 155.

According to some embodiments, the first brush sections 601 comprise a first brush material having a first porosity and the second brush sections 602 comprise a second brush material having a second porosity, the second brush material and the second porosity being different from the first brush material and the first porosity. In a particular embodiment, the first brush material of the first brush sections 601 comprise PBT and have a first porosity of between about 0% by volume and about 70% by volume, such as about 30% by volume and the second brush sections 602 comprise nylon (e.g., nylon 6) and have a second porosity of between about 0% by volume and about 70% by volume, such as about 30% by volume. As such, the first brush sections 601 may be used to remove materials such as, silicon oxide, silicon nitride, metal film, or the like, and combinations thereof and the second brush sections 602 may be used to remove materials such as, silicon oxide, silicon nitride, metal film, or the like, and combinations thereof.

FIG. 6B illustrates a top-down view of the bevel brush 155 in a first operating mode wherein the first brush sections 601 are placed in a working position and the second brush sections 602 are placed in a non-working position. In the working position, the first brush sections 601 are adjusted radially inward, closed around and are retaining the workpiece 101 between the front-side brushing surfaces housing the front-side dispensers 161 and/or the back-side brushing surfaces housing the back-side dispensers 163 of the first brush sections 601 are engaged with the bevel region of the workpiece 101. In the non-working position, the second brush sections 602 are adjusted radially outward and the front-side brushing surfaces housing the front-side dispensers 161 and/or the back-side brushing surfaces housing the back-side dispensers 163 of the second brush sections 602 are disengaged from the bevel region and are not touching the workpiece 101. As such, in the first operating mode during bevel film removal operations, the outer motor 153 rotates the first brush sections 601 and the second brush sections 602 about the workpiece 101; however, only the front-side brushing surface housing the front-side dispensers 161 and/or the back-side brushing surface housing the back-side dispensers 163 of the first brush sections 601 are actively abrading and/or removing potentially damaging materials from the bevel regions of the workpiece 101.

FIG. 6C illustrates a top-down view of the bevel brush 155 in a second operating mode wherein the first brush sections 601 are placed in a non-working position and the second brush sections 602 are placed in a working position. In the working position, the second brush sections 602 are adjusted radially inward, closed around and are retaining the workpiece 101. In the non-working position, the first brush sections 601 are adjusted radially outward, separated from and are not touching the workpiece 101. As such, in the second operating mode during bevel film removal operations, only the front-side brushing surface housing the front-side dispensers 161 and/or the back-side brushing surface housing the back-side dispensers 163 of the second brush sections 602 are actively abrading and/or removing potentially damaging materials from the bevel regions of the workpiece 101. According to some embodiments, the bevel brush 155 is adjusted to the second operating mode during a bevel film removal process prior to performing a cleaning process for the workpiece 101.

Figure 7:
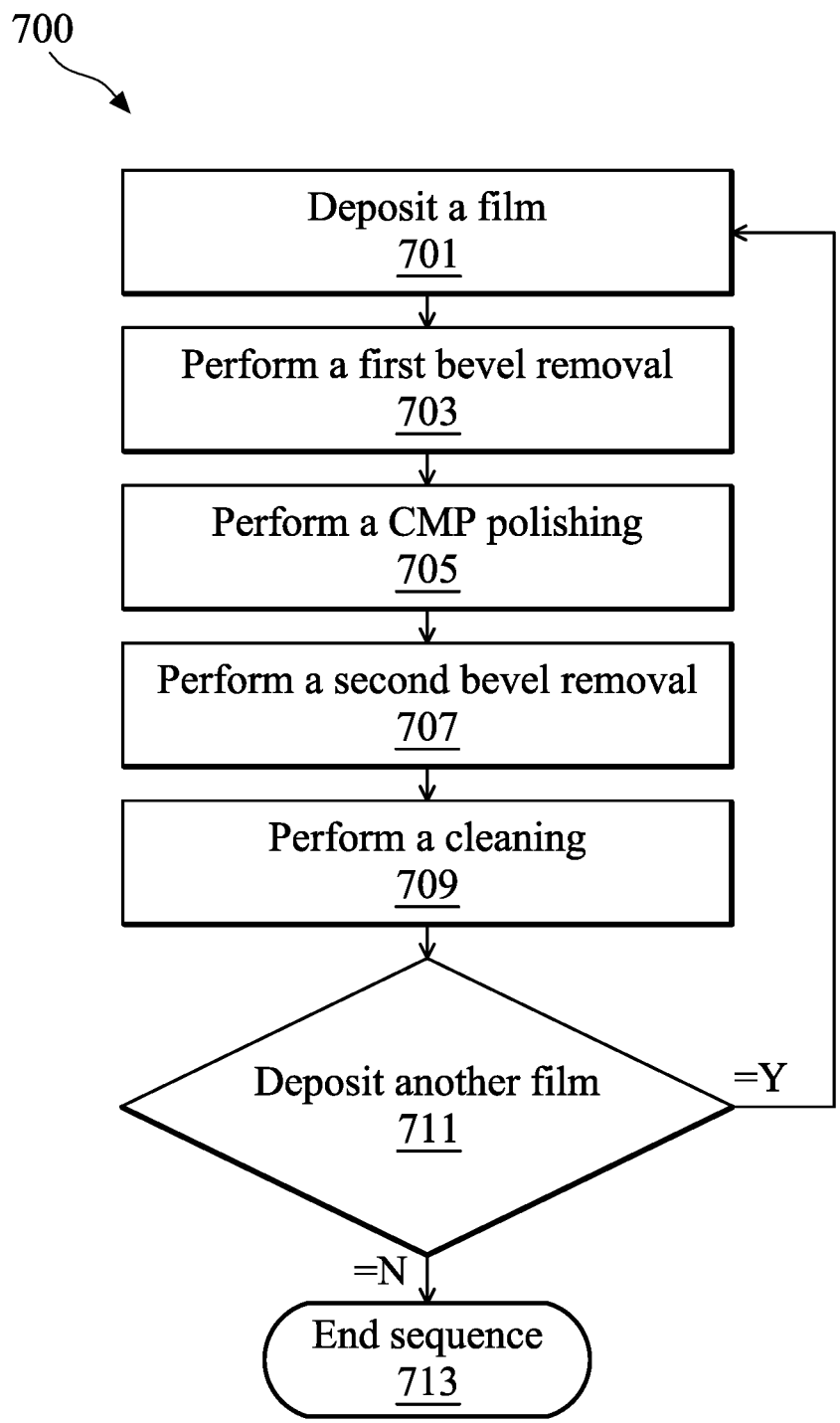
FIG. 7 illustrates a processing sequence for removing bevel films from a bevel region of a wafer, according to some embodiments.

FIG. 7 illustrates a processing sequence 700 for the workpiece 101, according to some embodiments. At step 701, one or more films and/or materials are deposited over a surface of the workpiece 101. The one or more films and/or materials may be formed using dielectric materials, conductive materials, and/or photoresist materials and may be deposited using one or more material deposition and etching processes in a suitable deposition chamber. The material deposition and etching processes include, but are not limited to, chemical vapor deposition (CVD), physical vapor deposition (PVD), oxidation processing, epitaxial deposition, photolithography processing, wet etching and/or dry etching.

At step 703, a first bevel removal process is performed prior to a CMP process. Once the film and/or material have been deposited and the workpiece 101 is ready for CMP processing, the workpiece 101 may be loaded in the CMP system 100 using the load ports 103. To initiate the first bevel removal process, the handler 105, e.g., using the robotic arm 111, may transfer the workpiece 101 to the bevel film removal tool 150, e.g., integrated in the polishing station 109, and place the workpiece 101 on the upper surface of inner motor 151. The bevel brush 155 of the bevel film removal tool 150 comprises, for example, first brush sections 601 and second brush sections 602 that are suitable for removing potentially harmful material of one or more of the films and/or materials deposited in the bevel region of the workpiece 101 at step 701. The storage unit containing the cleaning fluid 505 is coupled, for example, to the bevel film removal tool 150 and contains the cleaning fluid 505 that are suitable for assisting in the removal of material from the one or more films and/or materials deposited in the bevel region of the workpiece 101 at step 701.

Once the workpiece 101 has been placed on the inner motor 151, the bevel brush 155 is closed around and secures the workpiece 101 within the groove 159 and in accordance with some embodiments the bevel brush 155 is arranged in the first operating mode, as set forth above. According to some embodiments, the first bevel removal process at step 703 comprises a first bevel removal procedure. During the first bevel removal procedure, the cleaning fluid 505 is dispensed, the inner motor 151 is rotated in the reverse-rotation mode and the outer motor 153 rotates in the reverse-rotation mode, and the vacuum generating device generates a desired vacuum within the micro-channels 156. As such, the front-side brushing surface of the bevel brush 155 housing the front-side dispensers 161 and/or the back-side brushing surface of the bevel brush 155 housing the back-side dispensers 163 distribute the cleaning fluid 505 and actively abrade and/or remove the potentially damaging materials of the films in the bevel regions of the workpiece 101.

Optionally, if desired, the first bevel film removal process at step 703 may also comprise a second bevel film removal procedure. Once the first bevel film removal procedure has been complete, the bevel brush 155 is arranged in the second operating mode, as set forth above. According to some embodiments, during the second bevel film removal procedure, the cleaning fluid 505 is dispensed, the inner motor 151 is rotated in the reverse-rotation mode and the outer motor 153 rotates in the reverse-rotation mode, and the vacuum generating device generates a vacuum. Each of these parameters (e.g., spin-speed, material of the cleaning fluid 505, pressure, etc.) may be the same as or different than the parameters utilized in the first bevel film removal procedure. As such, the front-side brushing surface of the bevel brush 155 housing the front-side dispensers 161 and the back-side brushing surface of the bevel brush 155 housing the back-side dispensers 163 distribute the cleaning fluid 505 and actively abrade and/or remove one or more of the potentially damaging materials and/or films in the bevel regions of the workpiece 101 during the first bevel film removal process at step 703.

At step 705, a CMP polishing process, according to a desired CMP processing recipe, is performed on the workpiece 101 immediately after the performing the first bevel removal process of step 703. Once the film and/or material has been removed from the bevel region of the workpiece 101, the workpiece 101 is transferred via the robotic arm 111 to one of the high-rate platen 115 or the buffing platen 117 to perform the CMP polishing process. At the high-rate platen 115, a bulk removal of one or more of the film and/or material is performed on the workpiece 101 using a polishing pad and slurry suitable to thin and/or planarize the workpiece 101. At the buffing platen 117, a buffing or polishing of the one or more of the film and/or material is performed on the workpiece 101 using a polishing pad and slurry suitable to polish and/or remove surface scratches from the workpiece 101. According to some embodiments, the CMP polishing process at step 705 may comprise one or more of the CMP polishing processes performed at either or both of the high-rate platen 115 and the buffing platen 117.

At step 707, a second bevel removal process is performed immediately after the CMP polishing process of step 705. Once the CMP polishing process at step 705 has completed, the workpiece 101 may be transferred using the robotic arm 111 to the bevel film removal tool 150, e.g., integrated in the cleaning station 107, and placed on the upper surface of inner motor 151. The bevel brush 155 of the bevel film removal tool 150 integrated in the cleaning station 107 comprises, for example, first brush sections 601 and second brush sections 602 that are suitable for fixing wafer edge film defects and/or other surface damage in edge regions of the workpiece 101 resulting from the CMP process at step 705. The storage unit containing the cleaning fluid 505 is coupled, for example, to the bevel film removal tool 150 integrated into the cleaning station 107 and contains the cleaning fluid 505 that is suitable for fixing wafer edge film defects and/or other surface damage in edge regions of the workpiece 101 resulting from the CMP process at step 705.

Once the workpiece 101 has been placed on the inner motor 151, the bevel brush 155 is closed around and secures the workpiece 101 within the groove 159 of the bevel brush 155 and according to some embodiments the bevel brush 155 is arranged in the first operating mode, as set forth above. According to some embodiments, the second bevel removal process at step 707 comprises a third bevel removal procedure. During the third bevel removal procedure, the cleaning fluid 505 is dispensed and the inner motor 151 is rotated in the co-rotation mode and the outer motor 153 rotates in the co-rotation mode, and the vacuum generating device generates a vacuum. As such, the front-side brushing surface of the bevel brush 155 housing the front-side dispensers 161 and/or the back-side brushing surface of the bevel brush 155 housing the back-side dispensers 163 distribute the cleaning fluid 505 and actively fix wafer edge film defects and/or other surface damage in edge regions of the workpiece 101 during the third bevel film removal procedure of the second bevel film removal process at step 707.

Optionally, if desired, the second bevel film removal process at step 707 comprises a fourth bevel film removal procedure. Once the third bevel film removal procedure has been complete, the bevel brush 155 is arranged in the second operating mode, as set forth above. According to some embodiments, during the fourth bevel film removal procedure, the cleaning fluid 505 is dispensed, the inner motor 151 is rotated in the co-rotation mode and the outer motor 153 rotates in the co-rotation mode, and the vacuum generating device generates a vacuum. As such, the front-side brushing surface of the bevel brush housing the front-side dispensers 161 and/or the back-side brushing surface of the bevel brush 155 housing the back-side dispensers 163 distribute the cleaning fluid 505 and actively fix wafer edge film defects and/or other surface damage in edge regions of the workpiece 101 during the fourth bevel film removal procedure of the second bevel film removal process at step 707.

At step 709, a cleaning process, according to a desired CMP processing recipe, is performed on the workpiece 101. Once the wafer edge film defects and/or other surface damage in edge regions of the workpiece 101 have been fixed at step 707, the workpiece 101 is transferred via the robotic arm 111 to one of the roller brushes 119 or the cleaning bath 121 to perform the cleaning process. At the roller brushes 119, the workpiece 101 is cleaned using a cleaning solution comprising SC-1, $NH_4OH$, HF, citric acid, or other chemicals, for example, according to some embodiments. At the cleaning bath 121, the workpiece 101 may also be cleaned via a bath cleaning process. Once cleaned, the workpiece 101 may be transferred to the optional wafer dryer, in some embodiments, as set forth above. As such, substantially all of the CMP slurry and debris is removed from the workpiece 101.

At step 711, a determination is made as to whether another film and/or material are to be deposited to the workpiece 101. If it is decided, at step 711, that another film and/or material are to be deposited (=Y branch), the workpiece is transferred by the robotic arm 111 to the load ports 103 and returned to a deposition chamber suitable for the subsequent deposition. If it is decided, at step 711, that no more films and/or materials are to be deposited to the workpiece 101 (=N branch), the workpiece 101 is transferred by the robotic arm 111 to the load ports 103 for retrieval and the sequence is ended at step 713.

Figure 8A:
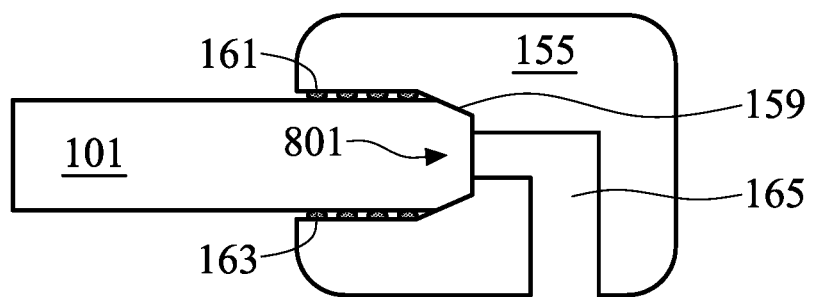
FIGS. 8A-8C illustrate magnified views of cross-sections of bevel brushes with different contoured surfaces for engaging workpieces having different profiles, in accordance with some embodiments.
Figure 8B:
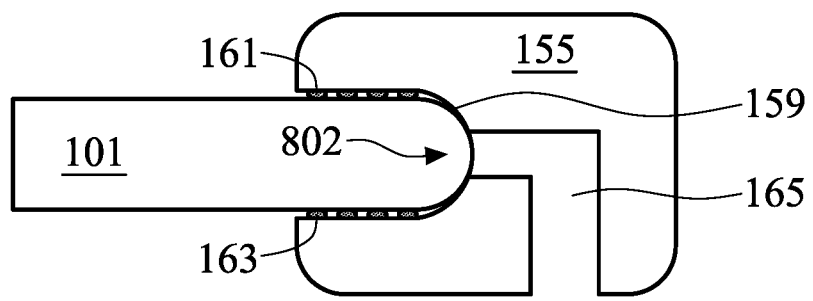
Figure 8C:
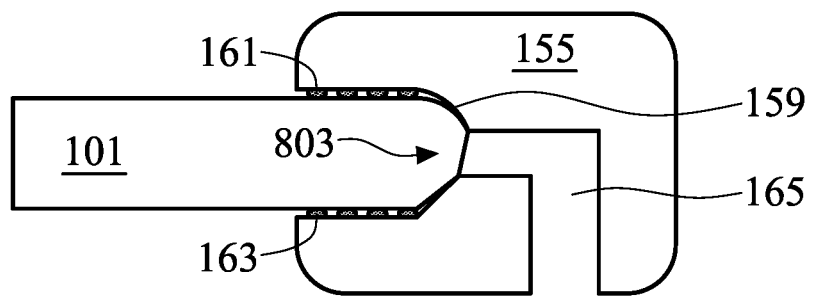

FIGS. 8A-8C illustrate magnified views of cross-sections of bevel brushes with different contoured surfaces for engaging workpieces having different profiles, in accordance with some embodiments. FIGS. 8A-8C illustrate several examples of the bevel brush 155, wherein the groove 159 has a shape that conforms to the bevel profile of the workpiece 100, according to some embodiments. In particular, FIG. 8A illustrates the bevel brush 155 with the groove 159 conforming to a first bevel profile 801 comprising slanted edges on the top and the bottom of the workpiece 100. FIG. 8B illustrates the bevel brush 155 with the groove 159 conforming to a second bevel profile 802 comprising rounded edges on the top and the bottom of the workpiece 100. FIG. 8C illustrates the bevel brush 155 with the groove 159 conforming to a third bevel profile 803 comprising a rounded edge on the top of the workpiece 100 and a slanted edge at the bottom of the workpiece 100. However, the workpiece 100 may comprise a bevel profile having any suitable shapes, sizes, and contours. Furthermore, when the bevel brush 155 is engaged with the workpiece 100, the contoured surfaces within the groove 159 may comprise any suitable shape to conform to any such bevel profile. The examples illustrated in FIGS. 8A-8C are merely representative of several shapes of the groove 159 and are not intended to be an exhaustive listing of all possible embodiments.

The bevel film removal tool 150 and methods disclosed herein may be used to remove any portions of the bevel edge film of a workpiece 101 (e.g., a wafer) which may break off or flake off and potentially damage surfaces in subsequent processes, thereby preventing contamination and/or deep wafer scratches from forming in the workpiece 101 during subsequent CMP processing. Once the potentially damaging portions of the bevel edge film of the workpiece 101 have been removed, the workpiece 101 may be planarized (e.g., via a CMP process) in a step of fabricating a semiconductor device. As such, excess materials (e.g., conductive materials, insulating materials, and the like) are removed from the surface of the workpiece 101 during planarization. The bevel removal process ensures the integrity of the build-up of materials of the semiconductor substrate during the handling and subsequent processing of the workpiece 101. Removing the potentially damaging portions of the film and/or material from the edge of the workpiece 101 allows the workpiece 101 to be processed and handled without any of the film and/or material at the edge peeling and/or flaking off and leading to potential contamination and/or deep wafer scratches during the subsequent manufacturing steps such as CMP processing. Furthermore, by removing all of the bevel film by chemical and mechanical forces applied by using the bevel brush and the cleaning solution, additional wet clean processes may be avoided. Thus, cost savings and improved chip production cycle time savings may be realized and increased yield and reliability may be achieved.

Additionally, by utilizing the bevel film removal tool 150 to remove portions of the materials which may peel off or flake off during subsequent processing, the bevel region may be made safer for subsequent processing without the need for costly additional process steps. For example, by making the bevel region safer, additional steps such as bevel wet clean steps (wherein one or more, or all, of the material deposited within the bevel region) along with their attendant processing steps (e.g., cleaning steps, prepping steps, rinsing steps, drying steps, etc.) may be removed and avoided all together. Such reduction in steps helps to improve chip production cycles times and overall costs.

According to an embodiment, a method includes: placing a workpiece into a chemical mechanical polishing tool; while within the chemical mechanical polishing tool, placing the workpiece within a groove of a brush with a first surface of the brush interfacing a bevel region of the workpiece; rotating at least one of the brush or the workpiece around a first axis of rotation and removing a material from the bevel region of the workpiece, the first axis of rotation extending through the workpiece. In an embodiment the placing the workpiece within the groove comprises adjusting a first set of brush sections radially inward to interface the bevel region. In an embodiment the method further includes dispensing a first solution at the first set of brush sections. In an embodiment the method further includes: adjusting the first set of brush sections radially outward to disengage the first set of brush sections; and adjusting a second set of brush sections radially inward to interface the bevel region. In an embodiment the method further includes dispensing a second solution at the second set of brush sections. In an embodiment the rotating the at least one of the brush or the workpiece further includes: rotating the brush in a first direction; and rotating the workpiece in a second direction, the second direction being opposite the first direction. In an embodiment the brush comprises nylon.

According to another embodiment, a method includes: locating a bevel brush around a wafer with a bevel region of the wafer interfacing a surface of the bevel brush; abrading the bevel region of the wafer using the surface of the bevel brush; distributing a solution to the bevel region of the wafer; and performing a chemical mechanical planarization on the wafer either immediately before or immediately after the abrading the bevel region and the distributing the solution. In an embodiment the abrading the bevel region comprises securing the bevel brush to a rotatable surface and rotating the bevel brush along the bevel region of the wafer. In an embodiment the abrading the bevel region comprises rotating the bevel brush along the bevel region of the wafer. In an embodiment the method further includes applying a vacuum to micro-channels of the bevel brush. In an embodiment the rotating the bevel brush includes rotating the bevel brush at a first speed and wherein the rotating the wafer includes rotating the wafer at a second speed in a same direction as the bevel brush, the second speed being different from the first speed. In an embodiment the first speed is at or below 1000 revolutions per minute and the second speed is at or above 10 revolutions per minute. In an embodiment the rotating the bevel brush is rotated in a first direction and wherein the rotating the wafer is rotated in a second direction, the second direction being opposite the first direction.

According to another embodiment, a semiconductor device processing system includes: an outer motor comprising a first rotatable surface; an inner motor nested within the outer motor, the inner motor comprising a second rotatable surface co-axially aligned with the first rotatable surface, the first rotatable surface being rotatable about the second rotatable surface; and a bevel brush secured to the first rotatable surface, wherein the bevel brush comprises a groove disposed between an inner surface and an outer surface of the bevel brush and wherein the bevel brush is radially adjustable. In an embodiment the bevel brush comprises a first material and a second material different from the first material. In an embodiment the first material is movable independently from the second material. In an embodiment the semiconductor device processing system further includes a cleaning solution dispenser extending through the bevel brush. In an embodiment the semiconductor device processing system further includes vacuum micro-channels extending through the bevel brush. In an embodiment the first rotatable surface is rotatable in a first direction and the second rotatable surface is rotatable in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device processing system comprising:
an inner motor comprising a top surface that is a rotatable platform, the inner motor being nested within a first motor;
a bevel brush attached to the first motor, wherein the bevel brush surrounds the top surface in a top down view, wherein the bevel brush comprises a first portion and a second portion movable relative to the first portion, wherein the first portion and the second portion are arranged in a circle in a top down view; and
a groove located within the bevel brush.

2. The semiconductor device processing system of claim 1, wherein the bevel brush comprises nylon.

3. The semiconductor device processing system of claim 1, wherein the first portion has a first porosity and the second portion has a second porosity different from the first porosity.

4. The semiconductor device processing system of claim 3, wherein the first porosity is between about 0% by volume and about 70% by volume.

5. The semiconductor device processing system of claim 4, wherein the first porosity is about 30% by volume.

6. The semiconductor device processing system of claim 1, wherein the rotatable platform is rotatable in a first direction and the bevel brush is rotatable in both the first direction and a second direction different from the first direction.

7. A semiconductor device processing system comprising:
a first motor nested within an co-axially aligned with an outer motor, the first motor comprising a flat, circular-shaped, upper surface service as a rotatable platform;
a bevel brush attached to the outer motor, wherein the bevel brush is a circle that surrounds the rotatable platform in a top down view, wherein the circle comprises a first portion and a second portion movable relative to the first portion, the first portion and the second portion both being in a single plane of the circle, the single plane also comprising a diameter of the circle; and
a groove located within the bevel brush.

8. The semiconductor device processing system of claim 7, wherein the bevel brush comprises nylon.

9. The semiconductor device processing system of claim 7, wherein the first portion has a first porosity and the second portion has a second porosity different from the first porosity.

10. The semiconductor device processing system of claim 9, wherein the first porosity is between about 0% by volume and about 70% by volume.

11. The semiconductor device processing system of claim 10, wherein the first porosity is about 30% by volume.

12. The semiconductor device processing system of claim 7, wherein the rotatable platform is rotatable in a first direction and the bevel brush is rotatable in both the first direction and a second direction different from the first direction.

13. A semiconductor device processing system comprising:
an inner motor nested within a first motor, the nested motor comprising a flat, circular-shaped, upper surface that is a rotatable platform;
a bevel brush attached to the first motor, wherein the bevel brush surrounds the rotatable platform in a top down view, wherein the bevel brush comprises a first portion and a second portion movable relative to the first portion;
a first groove located within the first portion of the bevel brush, the first groove extending across the first portion and the second portion; and
dispensers housed along sidewalls of the first groove.

14. The semiconductor device processing system of claim 13, wherein the bevel brush comprises nylon.

15. The semiconductor device processing system of claim 13, wherein the first portion has a first porosity and the second portion has a second porosity different from the first porosity.

16. The semiconductor device processing system of claim 15, wherein the first porosity is between about 0% by volume and about 70% by volume.

17. The semiconductor device processing system of claim 16, wherein the first porosity is about 30% by volume.

18. The semiconductor device processing system of claim 1, wherein the bevel brush comprises a third portion and a fourth portion movable relative to the first portion, wherein the first portion, the second portion, the third portion, and the fourth portion are arranged in the circle in the top down view.

19. The semiconductor device processing system of claim 7, wherein the groove extends across the first portion and the second portion.

20. The semiconductor device processing system of claim 13, wherein the dispensers are housed along sidewalls of the first groove in both the first portion and the second portion.

* * * * *